(12) United States Patent
Wu et al.

(10) Patent No.: US 11,425,818 B2
(45) Date of Patent: Aug. 23, 2022

(54) ELECTRONIC DEVICE

(71) Applicant: Innolux Corporation, Miao-Li County (TW)

(72) Inventors: Chialung Wu, Miao-Li County (TW); Wen-Chieh Lin, Miao-Li County (TW); Chia Chun Yang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/168,189

(22) Filed: Feb. 5, 2021

(65) Prior Publication Data

US 2021/0259109 A1 Aug. 19, 2021

(30) Foreign Application Priority Data

Feb. 13, 2020 (CN) .......................... 202010090993.1

(51) Int. Cl.
*H05K 1/11* (2006.01)
*H05K 1/02* (2006.01)
(Continued)

(52) U.S. Cl.
CPC ............. *H05K 1/118* (2013.01); *H05K 1/028* (2013.01); *H05K 1/147* (2013.01);
(Continued)

(58) Field of Classification Search
CPC ...... H05K 1/118; H05K 1/028; H05K 1/0281; H05K 1/189; H05K 1/14; H05K 1/144;
(Continued)

(56) References Cited

U.S. PATENT DOCUMENTS

| 8,675,166 B2* | 3/2014 | Hirakata | G02F 1/1339 |
| | | | 349/149 |
| 2002/0117669 A1* | 8/2002 | Aruga | H05K 1/189 |
| | | | 257/E23.177 |

(Continued)

FOREIGN PATENT DOCUMENTS

| TW | 201304637 | 1/2013 | |
| TW | I646873 | 1/2019 | |
| WO | WO-2013183709 A1 * | 12/2013 | ........... H05K 1/0393 |

OTHER PUBLICATIONS

WO 2013/183709 A1 Translation (Year: 2021).*

*Primary Examiner* — Hoa C Nguyen
*Assistant Examiner* — John B Freal
(74) *Attorney, Agent, or Firm* — JCIPRNET

(57) ABSTRACT

The disclosure provides an electronic device, including a base, a flexible substrate, and a plurality of wires. The base has an active area and a peripheral area. The flexible substrate is disposed on the peripheral area and the base. The plurality of wires are disposed on the base and the flexible substrate. The plurality of wires extend from the active area to the peripheral area, and the peripheral area partially overlaps the frame portion. The plurality of wires extend along the frame portion to the extension portion. And the flexible substrate is provided between the plurality of wires and the base. The electronic device in the disclosure is conducive to providing smaller wire pitch, reducing the difficulty in connecting the electronic device and the leads of an external circuit board.

20 Claims, 7 Drawing Sheets

(51) Int. Cl.
*H05K 1/14* (2006.01)
*H05K 1/18* (2006.01)
*H01L 27/32* (2006.01)

(52) U.S. Cl.
CPC .......... *H01L 27/3276* (2013.01); *H05K 1/189* (2013.01); *H05K 2201/10128* (2013.01)

(58) Field of Classification Search
CPC .......... H05K 1/147; H05K 1/11; H05K 1/393; H05K 2201/05; H05K 2201/055; H05K 2201/056; H05K 2201/058; H05K 2201/10128; H05K 2201/09163; H05K 2201/09172; H05K 2201/09236; H05K 2201/09254
See application file for complete search history.

(56) References Cited

U.S. PATENT DOCUMENTS

| | | | | |
|---|---|---|---|---|
| 2007/0216670 | A1* | 9/2007 | Yatsu | G09G 3/22 345/205 |
| 2012/0292085 | A1* | 11/2012 | Watanabe | H05K 1/024 174/254 |
| 2013/0343012 | A1* | 12/2013 | Park | H04M 1/0266 361/679.01 |
| 2014/0042406 | A1* | 2/2014 | Degner | H05K 1/028 257/40 |
| 2017/0162821 | A1* | 6/2017 | Oh | G06F 1/1652 |
| 2017/0170255 | A1* | 6/2017 | Ha | H01L 27/3276 |

\* cited by examiner

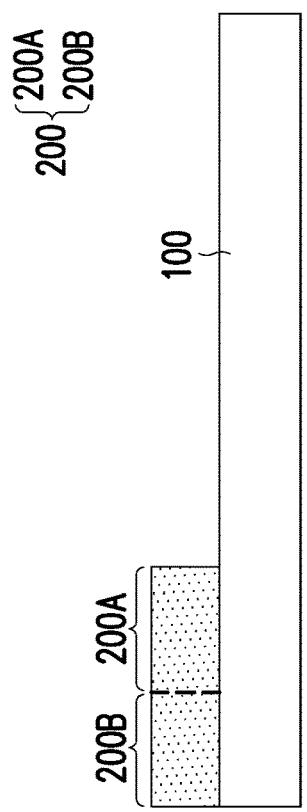
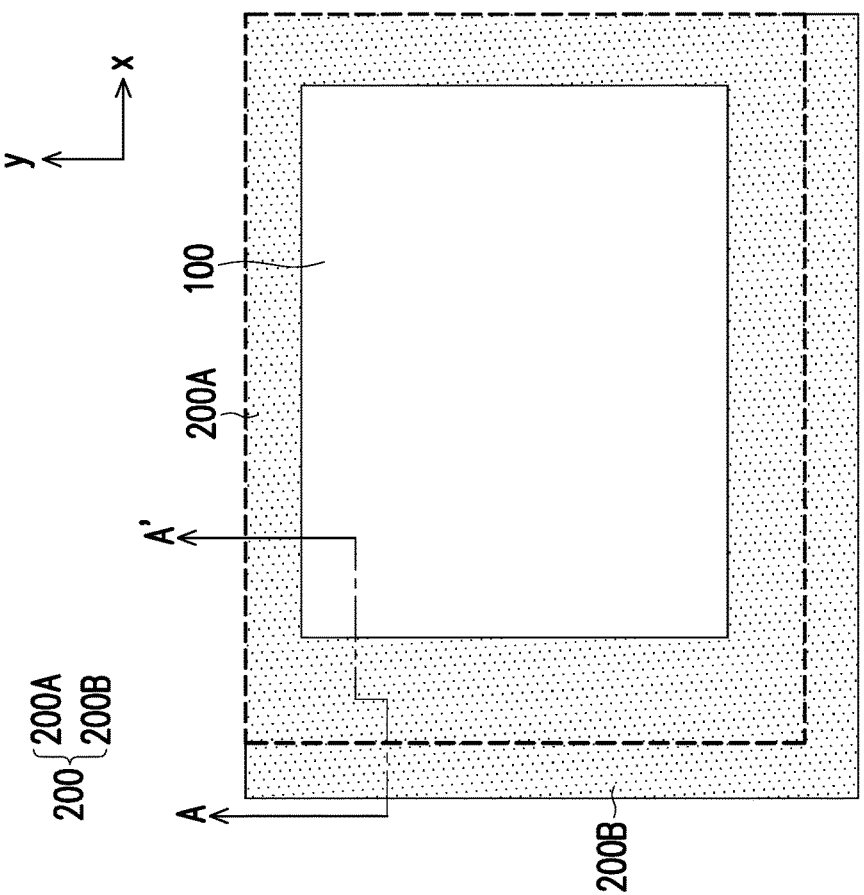
FIG. 4A
FIG. 3A

ELECTRONIC DEVICE

CROSS-REFERENCE TO RELATED APPLICATION

This application claims the priority benefit of China application serial no. 202010090993.1, filed on Feb. 13, 2020. The entirety of the above-mentioned patent application is hereby incorporated by reference herein and made a part of this specification.

BACKGROUND

Technical Field

The disclosure relates to an electronic device.

Description of Related Art

The electronic products have become a necessity in the modern society. With the vigorous development of the electronic products, consumers also develop high expectations for the quality, function, and price of these products.

As the structural precision of electronic products gets higher, the current technology and the manufacturing process for these high-precision structures also grow to be more difficult accordingly. Along with the increasingly higher pixel density of electronic devices, the routing of electronic devices becomes denser, causing the pitch between the leads for connecting the flexible printed circuit (FPC) or chip on film (COF) to be correspondingly smaller. Therefore, the level of difficulty in manufacturing the leads of the FPC or COF has also increased. Also, as the lead pitch becomes smaller, the connection made between the electronic device and the leads also becomes more challenging. Therefore, an electronic device that improves or eliminates the above problems is in need.

SUMMARY

The disclosure provides an electronic device, including a base, a flexible substrate, and a plurality of wires. The base has an active area and a peripheral area. The flexible substrate is formed on the peripheral area and the base. The wires are disposed on the base and the flexible substrate. The plurality of wires extend from the active area to the peripheral area, and the peripheral area partially overlaps the frame portion. The plurality of wires extend along the frame portion to the extension portion. And the flexible substrate is provided between the wires and the base.

Based on the above, in the embodiments of the present disclosure, the plurality of wires extend from the active area to the peripheral area which partially overlaps the frame portion, the plurality of wires extend along the frame portion to the extension portion, and the flexible substrate is provided between the plurality of wires and the base. This configuration changes the part where needs to be connected to an external circuit board to a flexible substrate which is integrated into the base manufacturing process, which helps reduce the pitch between the plurality of wires, or reduce the difficulty in connecting the electronic device and the external circuit board, increasing the pixel density or wiring density of the display device.

The embodiments accompanied with drawings are described below in detail to provide a further understanding of the aforementioned features and the advantages of the disclosure.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain the principles of the disclosure.

FIG. 3A to FIG. 3C are schematic top views of an manufacturing process of an electronic device according to an embodiment of the disclosure.

FIG. 4A to FIG. 4C are schematic cross-sectional views along the line A-A' in FIG. 3A to FIG. 3C.

DESCRIPTION OF THE EMBODIMENTS

Figure 2:
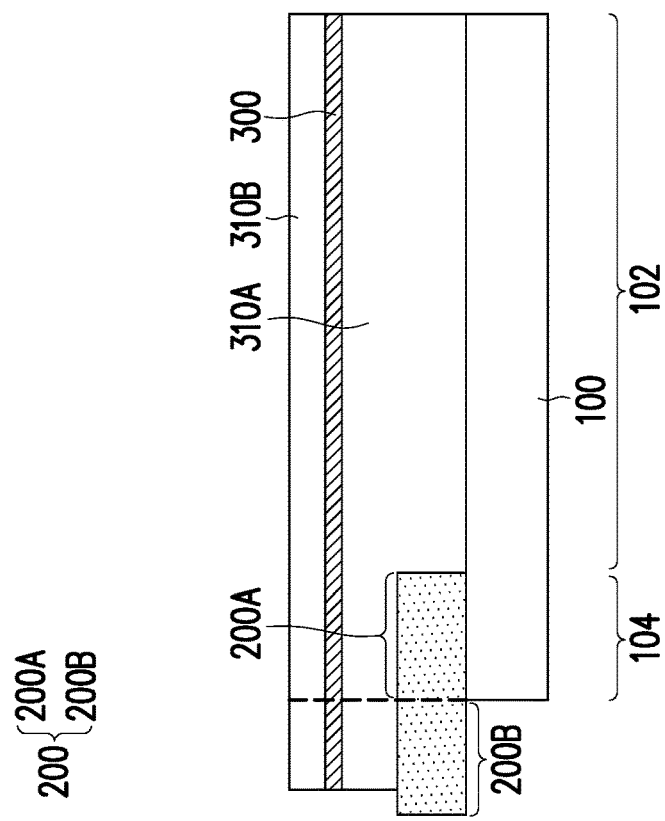
FIG. 2 is a schematic cross-sectional view along the line A-A' in FIG. 1.

The disclosure may be understood by referring to the following detailed description and the accompanying drawings. It should be duly noted that, for the ease of readers' comprehension and the simplicity of the drawings, the drawings of this disclosure only illustrate parts of the electronic device, and the specific elements in the drawings may not be drawn to the actual scale ratio. Also, the number and size of each element in the drawings are only for schematic use, and do not limit the scope of the disclosure. For example, the relative size, thickness, and location of each region and/or structure may be reduced or enlarged for clarity.

Throughout the disclosure and the appended claims, certain terms are used to refer to specific elements. Persons skilled in the art should understand that the manufacturers of electronic apparatus may not refer to the same element with same terms. The disclosure does not intend to distinguish those elements having the same function but with different names. In the following description and claims, the words "comprise" and "include" are open-ended words, so they should be interpreted as "including but not limited to."

And the wordings used to indicate directions, such as "up," "down," "front," "back," "left," and "right," merely refer to directions in the drawings. As such, the directional terminology is used for purposes of illustration without the purposes of putting further limitations.

It should be understood that when an element or film layer is referred to as being "on" or "connected" to another element or film layer, the element or film layer may be directly on the other element or film layer, or directly connected to the other element or film layer, or there is an intervening element or film layer there between (an indirect situation). Conversely, when an element or film layer is referred to be "directly" on or "directly connected" to another element or film layer, there is no intervening element or film layer there between.

In some embodiments of the disclosure, unless defined specifically, terms relating to bonding and connection, such as "connected", "interconnected", etc., indicate that the two structures are in direct contact, that the two structures are not in direct contact, or that there is other structure located between the two structures. Terms relating to joining and connection include the situations in which the two structures are movable and that the two structures are fixed.

The terms "about", "substantially", "equal to" or "approximately" mentioned herein generally represent falling within 10% of a given value or range, or represent falling within 5%, 3%, 2%, 1% or 0.5% of the given value or range. In addition, the terms "the given range is from a first value to a second value" and "the given range falls within the range of the first value to the second value" mean that the given range includes the first value, the second value and other values between the first value and the second value.

In the following embodiments, the same or similar elements are designated with the same or similar reference numerals, and descriptions thereof will be omitted. In addition, features of different embodiments may be adapted in combination with one another as long as they do not violate or in conflict with the spirit of the disclosure, and simple equivalent changes and modifications made according to the specification or the claims are within the scope of the disclosure. In addition, the terms such as "first" and "second" mentioned in the specification or the claims are only used to name discrete elements or to distinguish different embodiments or scopes and are not intended to limit the upper or lower limit of the number of the elements, nor are they intended to limit the manufacturing order or disposition order of the elements.

In the disclosure, different embodiments described below may be in combination with one another as long as they do not violate or in conflict with the spirit of the disclosure. For example, part of the features of an embodiment may be combined with part of the features of another embodiment to form yet another embodiment.

Reference will now be made in detail to the exemplary embodiments of the present disclosure, and examples of the exemplary embodiments are illustrated in the accompanying drawings. Whenever possible, the same reference symbols are used in the drawings and the description to indicate the same or similar parts.

Figure 1:
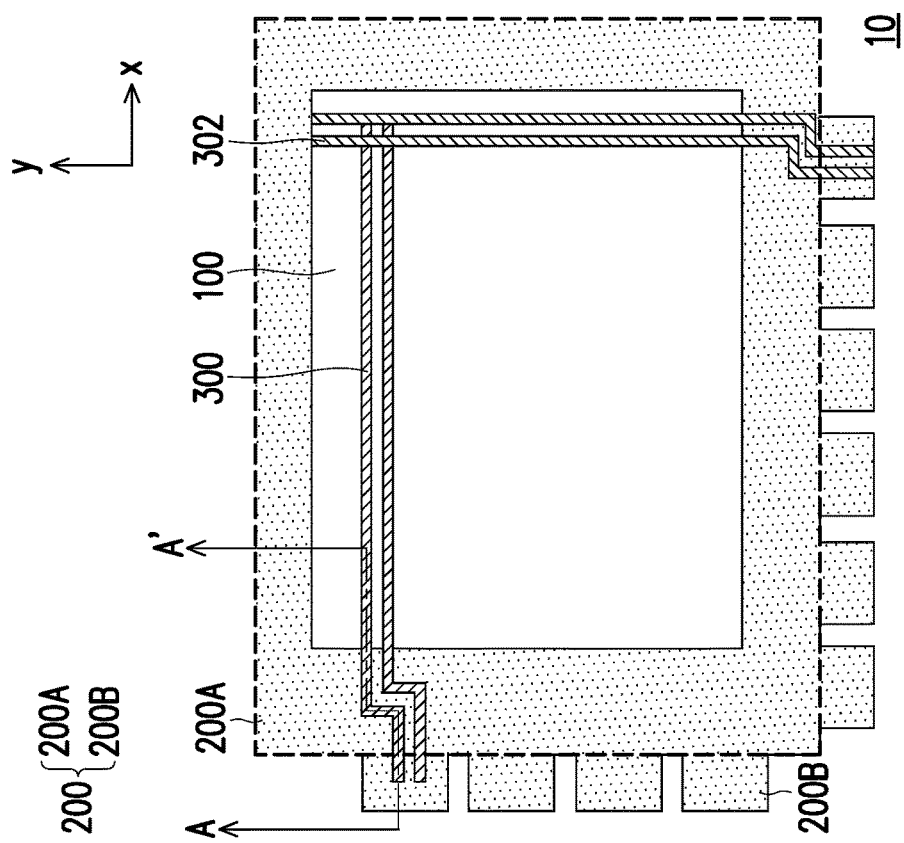
FIG. 1 is a schematic top view of an electronic device according to an embodiment of the disclosure.

FIG. 1 is a schematic top view of an electronic device according to an embodiment of the disclosure. FIG. 2 is a cross-sectional view along line A-A' in FIG. 1. In FIG. 1 and FIG. 2, an electronic device 10 of the present disclosure includes a base 100, a flexible substrate 200, wires 300, and wires 302. Although the wires 300 and the wires 302 are shown as in FIG. 1, the number and configuration of the wires are not limited thereto. The configuration of the wires may be disposed substantially along an X direction (for example, the wire 300) or along a Y direction (for example, the wire 302).

The electronic device includes a display device, an antenna device, a sensing device, a touch display, a curved display, or a free shape display, but the disclosure is not limited thereto. The electronic device may be a bendable or flexible electronic device. The electronic device includes, for example, liquid crystal, light emitting diode, fluorescence, phosphor, other suitable display medium, and a combination of the foregoing, but the disclosure is not limited thereto. The light emitting diode includes, for example, an organic light emitting diode (OLED), a sub-millimeter light emitting diode (mini LED), a micro LED, or a quantum dot (QD) light emitting diode (for example, QLED and QDLED), other suitable materials, and any permutation and combination of the above materials, but the disclosure is not limited thereto. The display device includes, for example, a spliced display device, but is not limited thereto. The antenna device includes, for example, a liquid crystal antenna, but is not limited thereto. The antenna device includes, for example, a spliced antenna device, but is not limited thereto. Note that the electronic device may be an arbitrary arrangement and combination of the aforementioned, but the disclosure is not limited thereto. In addition, the appearance of the electronic device may be rectangular, circular, polygonal, a shape with curved edges, or other suitable shapes. The electronic device may have peripheral systems, such as a drive system, a control system, a light source system, a shelf system, etc., to support a display device, an antenna device, or a spliced device. The electronic device is described as a display device as follows to disclose the content of the present disclosure, but the disclosure is not limited thereto.

The material of the base 100 includes, for example, glass, sapphire, polyethylene terephthalate (PET), and other materials suitable for a base, but the disclosure is not limited thereto. The material of the flexible substrate 200 may include, for example, polyimide (PI), but not limited to this. Other materials with characteristics such as flexibility, high temperature resistance, or high insulation, may also be adopted herein. The base 100 has an active area 102 and a peripheral area 104. The flexible substrate 200 includes a frame portion 200A and an extension portion 200B (the area outside the dashed lines in FIG. 1 and FIG. 2). The frame portion 200A is adjacent to the active area 102, and the frame portion 200A is located in at least part of the peripheral area 104. In an embodiment, the frame portion 200A may surround the active area 102. In another embodiment, the frame portion 200A may be located on one side or more than one side of the active area 102, and the extension portion 200B may include a plurality of locks. Specifically, the frame portion 200A is a part of the flexible substrate 200, and the frame portion 200A is located in the peripheral area 104 and on the base 100. The extension portion 200B is a part of the flexible substrate 200, and the extension portion 200B extends beyond the edge of the base 100. In one embodiment, the extension portion 200B extends beyond the edge of the base 100 and be folded to the back side of the base 100. In another embodiment, the extension portion 200B is foldable and fixed to a side (not illustrated) of the base 100.

An insulating layer 310A and an insulating layer 310B may be selectively disposed on the base 100 and a part of the flexible substrate 200. In one embodiment, the insulating layer 310A or the insulating layer 310B may extend from the active area 102 to the frame portion 200A in the peripheral area 104. In another embodiment, the insulating layer 310A or the insulating layer 310B may further extend from the frame portion 200A to and the extension portion 200B. The materials of the insulating layer 310A and the insulating layer 310B include high temperature resistance materials or insulating materials, such as SiNx, SiOx, SiOxNx, photosensitive polyimide (PSPI), but are not limited thereto. The insulating layer 310A and the insulating layer 310B may be the same materials or the different materials. The insulating layer 310A or the insulating layer 310B may be selectively disposed, and the area of the insulating layer 310A or the area of the insulating layer 310B may be different. For example, the area of the insulating layer 310A is smaller than the area of the insulating layer 310B. In some embodiments, the configuration of the insulating layer 310A and the insulating layer 310B may be adjusted according to the needs of design. For example, the following embodiments choose both the insulating layer 310A and the insulating layer 310B to be disposed, but the number and the configuration of the insulating layer(s) may be adjusted based on the aforementioned characteristics and the needs of design.

The wires 300 and the wires 302 are disposed on the base 100 and the flexible substrate 200. The wires 300 and the wires 302 may extend from the active area 102 to the peripheral area 104. The peripheral area 104 partially overlaps the frame portion 200A. The wires 300 and the wires 302 are disposed in the peripheral area 104 and upon the frame portion 200A, and extend along the frame portion 200A to the extension portion 200B. The flexible substrate 200 is disposed between the wires 300 and the base 100. In one embodiment, the wires 300 are disposed between the insulating layer 310A and the insulating layer 310B. FIG. 2 is a schematic cross-sectional view along the line A-A' in FIG. 1, providing illustration specifically for the wire 300. Note that the wire 302 may be disposed similarly to the wire 300, and that the wires 302 are disposed between two insulating layers (not illustrated in the figures), but the wires 302 and the wires 300 are disposed between different insulating layers. For example, the wires 300 are disposed between the insulating layer 310A and the insulating layer 310B, and the wires 302 may be disposed between the insulating layer 310B and another insulating layer (not illustrated herein) upon the insulating layer 310B. In another embodiment, the insulating layer 310A may be disposed between the frame portion 200A of the flexible substrate 200 and the wires 300.

The wires 300 and the wires 302 may be disposed on the same layer as any conductive layer in the active area 102, that is, the wires 300 and the wires 302 may be made in the same process with any conductive layer in the active area 102 on the same layer. And the conductive layer in the active area 102 includes, for example, a first conductive layer (M1), a second conductive layer (M2), and a third conductive layer (M3). In some embodiments, for example, the first conductive layer (M1) may be at the same layer as a scan line, a gate, or a common line; the second conductive layer (M2) may be at the same layer as a data line, a source, or a drain; and the third conductive layer (M3) may be at the same layer as a touch line or a common line. In addition, the wires 300 and the wires 302 may have the function of transmitting information or supplying power voltage. When the wires 300 and the wires 302 extend from the active area 102 to the peripheral area 104, wires 300 and wires 302 may be disposed in different layers. For example, a part of the wires in the active area 102 and a part of the wires in the peripheral area 104 may be disposed in different layers, and their routings may be transferred to other layers through via holes, or they may be electrically connected by contacting directly conductive layers from different layers without passing through vias. In one embodiment, the wire 302 may be transferred from the second conductive layer (M2) to the first conductive layer (M1) when extending from the active area 102 to the peripheral area 104, and a part of the wire 302 in the active area 102 belongs to the second conductive layer (M2) and part of the wire 302 in the peripheral area 104 belongs to the first conductive layer (M1).

Figure 4B:
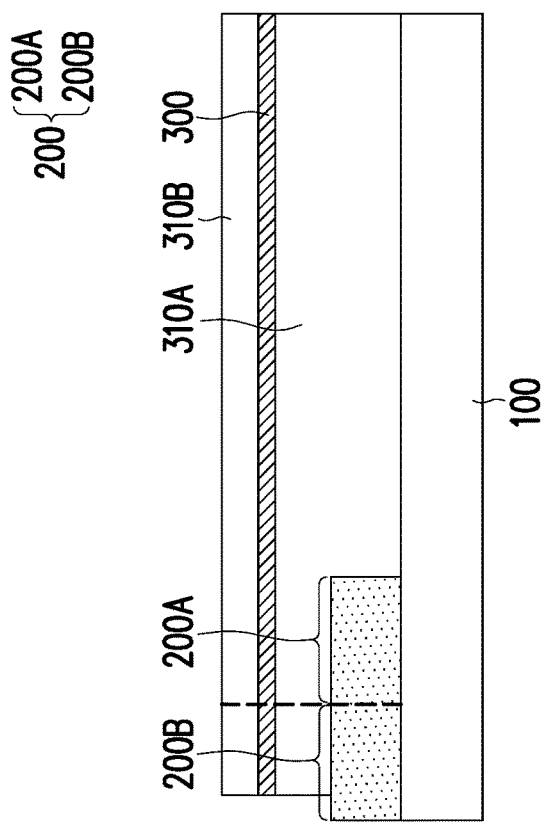
Figure 3B:
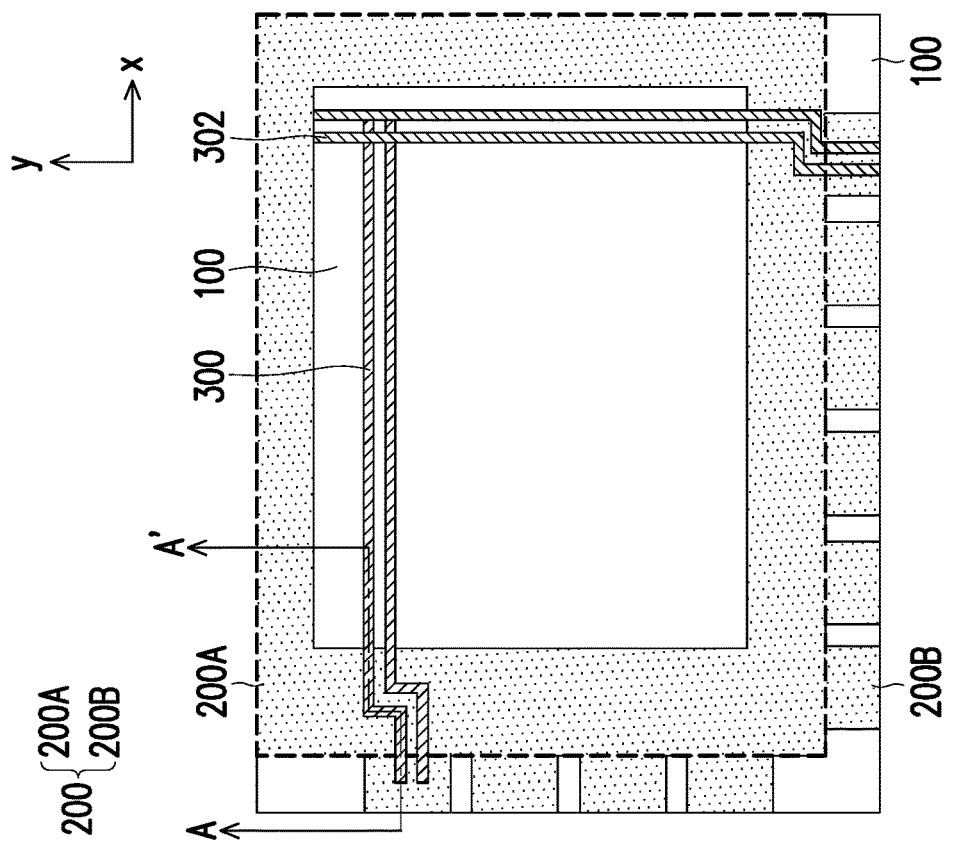
Figure 4C:
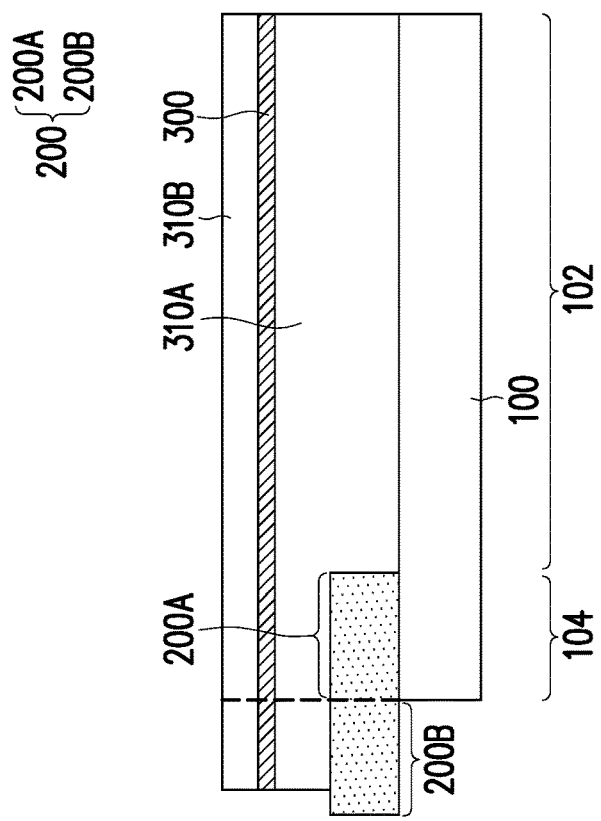
Figure 3C:
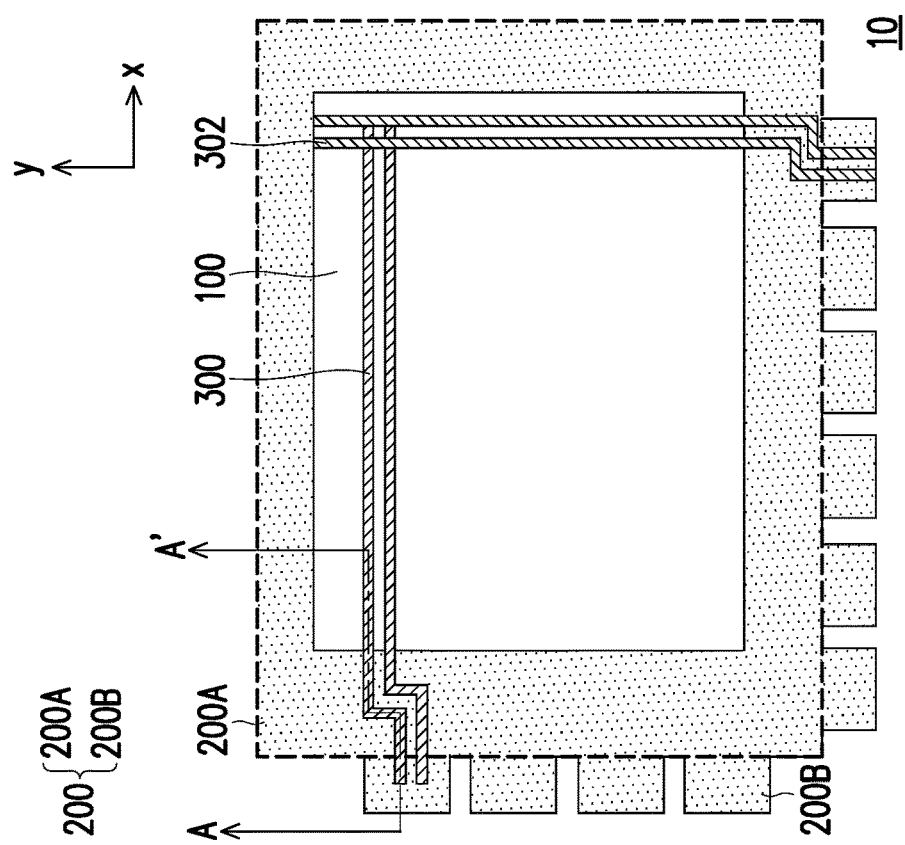

FIG. 3A to FIG. 3C are schematic top views of an manufacturing process of an electronic device according to an embodiment of the disclosure. FIG. 4A to FIG. 4C are schematic cross-sectional views taken along the line A-A' in FIG. 3A to FIG. 3C. As shown in FIG. 3A and FIG. 4A, the flexible substrate 200 is formed on the base 100, and the forming process may include an attaching process or a coating process. For example, the thickness of the flexible substrate 200 formed by the attaching process is, for example, 20 μm to 40 μm, and the thickness of the flexible substrate 200 formed by the coating process is, for example, less than 20 μm. The material of the flexible substrate 200 may include, for example, polyimide (PI) or other materials that are bendable and suitable. Other materials with characteristics such as flexibility, high temperature resistance, or insulation may also be adapted. The flexible substrate 200 may include a frame portion 200A and an extension portion 200B (the extension portion 200B may be the area outside the dotted line in FIG. 3A and FIG. 4A). After the flexible substrate 200 is formed, the extension portion 200B of the flexible substrate 200 may then be cut. The cutting process may include a knife wheel cutting, laser cutting, or other suitable cutting processes, so that the extension portion 200B may include a plurality of blocks, exposing the active area 102 of base 100. The extension portion 200B may include a plurality of blocks. And different blocks may be extended by wires from different areas to transfer or control information in different areas; or, when a block is defected or the wires on it are broken, a block may be removed independently such that the follow-up repairs may be performed.

Then, in FIG. 3B and FIG. 4B, the insulating layer 310A is disposed on the flexible substrate 200 and the base 100, and the wires 300 are disposed on the insulating layer 310A. Although the wires 300 and the wires 302 are shown as in FIG. 3B, the number and configuration of the wires are not limited thereto. The wires may be substantially extended along an X direction (for example, the wire 300) or the wires may be substantially extended along a Y direction (for example, the wire 302). The insulating layer 310B is disposed on the wires 300, and then the wires 302 are disposed on the insulating layer 310B. Other layers on the base 100 are omitted here.

Next, referring to FIG. 3C and FIG. 4C, the base 100 is cut. And the cutting process may include, for example, a knife wheel cutting or laser cutting, so that the extension portion 200B extends beyond the edge of the base 100, and the extension portion 200B may be, for example, folded to the back side of the base 100 or folded to a lateral side of the base 100. The extension portion 200B may selectively reserve only the area where the wires 300 and the wires 302 or electronic components are disposed. The area of the extension portion 200B where the wires 300 and the wires 302 or other electronic components are not disposed may be cut off to form its appearance as needed to cater to a special-shaped panel or customized requirements. The electronic components may include logic integrated circuits, touch integrated circuits, or other suitable active or passive components. The disclosure configures the wires to extend from the active area to the peripheral area which partially overlaps the frame portion and extends further along the frame portion to the extension portion, and disposes the flexible substrate between the wires and the base. Such configuration changes the part where needs to be connected to an external circuit board to a flexible substrate which is directly integrated into the base manufacturing process, such that the wires 300 and the wires 302 extending from the active area to the extension portion may be completed altogether, solving the difficulty in connecting the external circuit board and the electronic device with the increasingly high pixel density or wiring density, and thereby increasing the process yield and the wiring density.

Figure 5:
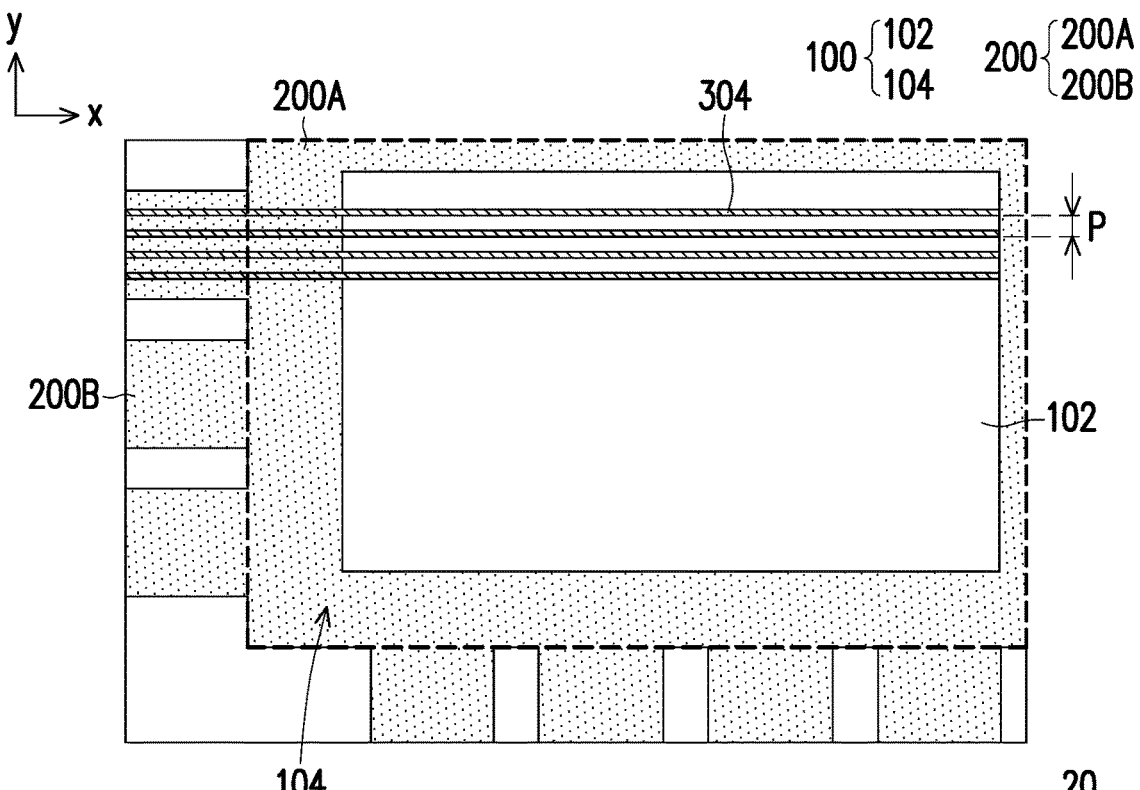
FIG. 5 to FIG. 8 are schematic top views of an electronic device according to some embodiments of the disclosure.
Figure 6:
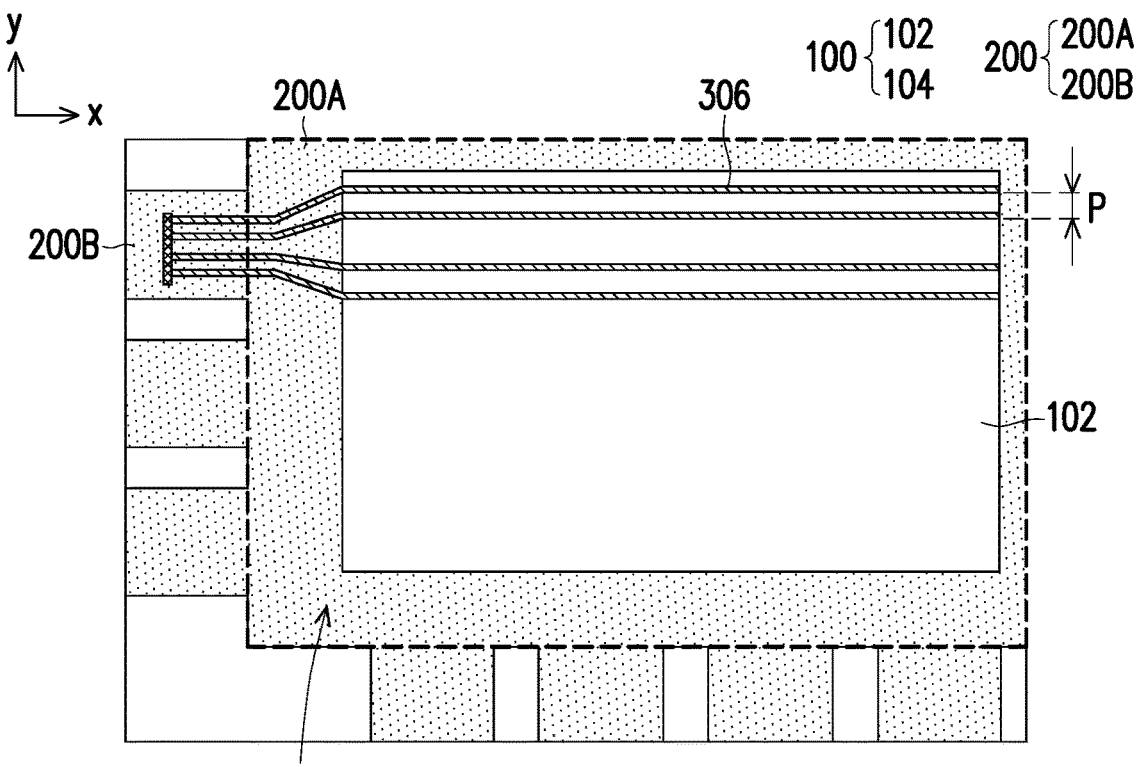
Figure 7:
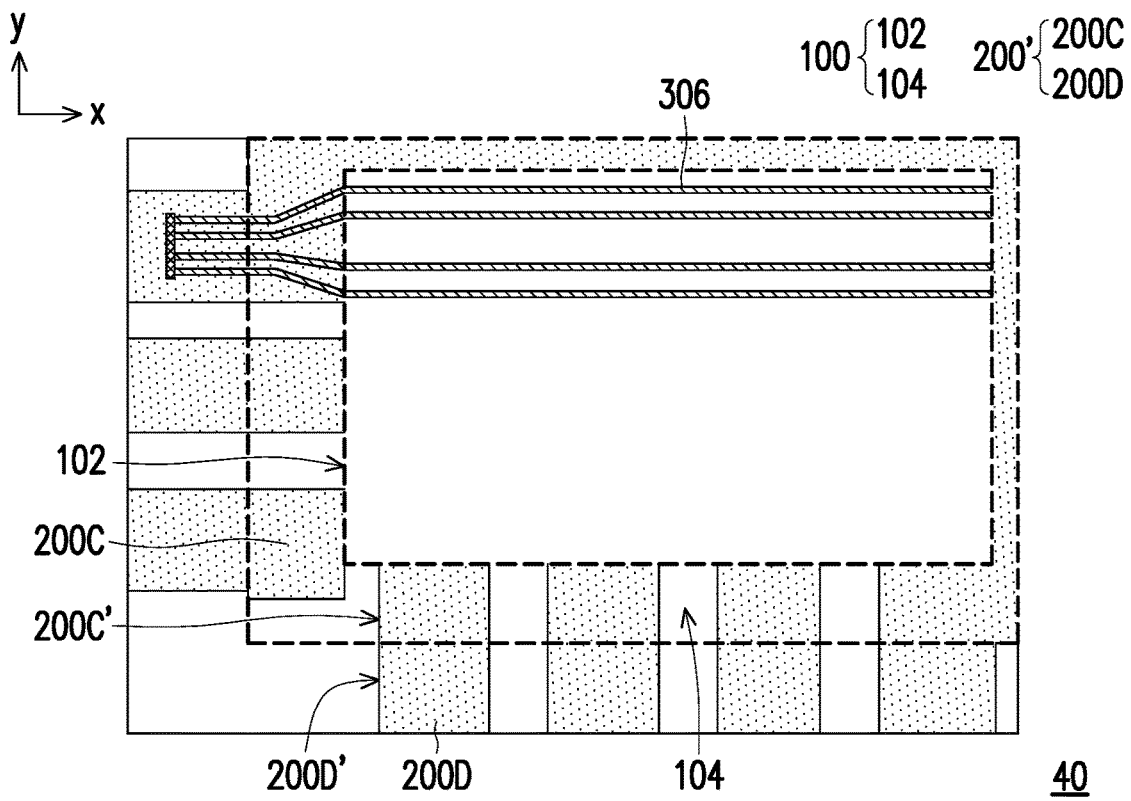
Figure 8:
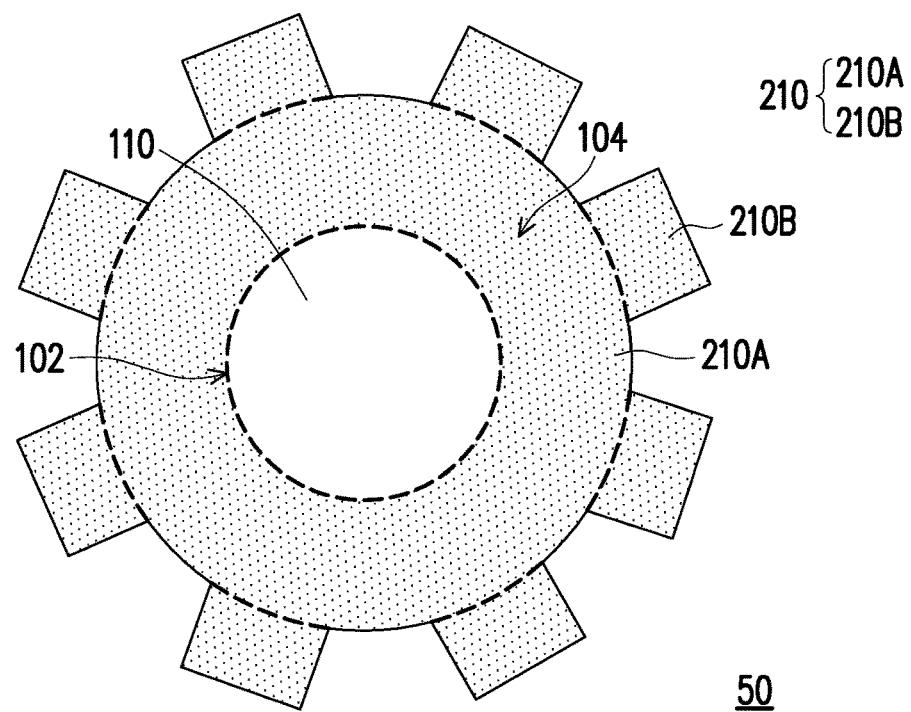

FIG. 5 to FIG. 8 are schematic top views of electronic devices serving as some of the variation examples of the present disclosure. FIG. 5 to FIG. 7 are schematic views of an uncut base 100 (the area of the base 100 where exceeds a frame portion 200A has not been cut), and FIG. 8 is a schematic view of the cut base 100 (the area of the base 100 where exceeds the frame portion 200A has been cut off). In FIG. 5, an electronic device 20 includes a base 100, a flexible substrate 200, and wires 304. Although the wires 304 are substantially extended along an X direction as shown in FIG. 5, the number and configuration of the wires are not limited thereto. The configuration of the wires may also be substantially extended along a Y direction. The base 100 has an active area 102 and a peripheral area 104. The flexible substrate 200 includes a frame portion 200A and an extension portion 200B (the extension portion 200B may be the area outside the dashed line in FIG. 5). The frame portion 200A is adjacent to the active area 102, and the frame portion 200B may include a plurality of blocks and extends beyond edge of the base 100. In one embodiment, the extension portion 200B may be folded to the back side of the base 100. In another embodiment, the extension portion 200B may be foldable and fixed to a lateral side (not illustrated herein) of the base 100. The wires 304 are disposed on the base 100 and the flexible substrate 200. The wires 304 may extend from the active area 102 to the peripheral area 104 at equal intervals. The peripheral area 104 partially overlaps the frame portion 200A. The wires 300 and the wires 302 are disposed on the peripheral area 104 and the frame portion 200A, and extend along the frame portion 200A to the extension portion 200B. The flexible substrate 200 is disposed between the wires 304 and the base 100. In this embodiment, at least a part of the wires 304 may selectively extend from the frame portion 200A to the extension portion 200B at equal intervals, but it is not limited thereto. In the extension portion 200B, a pitch P between two adjacent of the plurality of wires 304 may be 30 µm to 40 µm in some embodiments, 10 µm to 26 µm in some embodiments, and 3 µm to 10 µm in some embodiments. A smaller wire pitch helps to reduce the difficulty in the manufacturing process or increase the wiring density. The pitch mentioned here is defined as a line width of one of the wires plus the distance between the two wires.

Referring to FIG. 6, an electronic device 30 includes a base 100, a flexible substrate 200, and wires 306. Although the wires 306 are extended along an X direction as shown in FIG. 6, the number and configuration of the wires are not limited thereto. The configuration of the wires may be disposed along a Y direction. The wires 306 are disposed on the base 100 and the flexible substrate 200. The wires 306 may extend from the active area 102 to the peripheral area 104. The peripheral area 104 partially overlaps the frame portion 200A. The wires 306 are located on the peripheral area 104 and the frame portion 200A, and extend along the frame portion 200A to the extension portion 200B. The flexible substrate 200 is provided between the wires 306 and the base 100. In this embodiment, at least part of the wires 306 may extend from the frame portion 200A to the extension portion 200B with an optionally unequal pitch P between the at least part of the wires 306, but the disclosure is not limited thereto. For example, the closer at least part of the wires 306 are to the extension portion 200B, the smaller the pitch P. Specifically, the wires 306 may extend in the active area 102 along the X direction and fan-out in the peripheral area 104. In the peripheral area 104, the pitch P of the wires 306 may be 30 µm to 40 µm in some embodiments, 10 µm to 26 µm in some embodiments, and 3 µm to 10 µm in some embodiments. A smaller wire pitch P helps increase the pixel density or the wiring density of the display. The pitch P mentioned here is defined as a line width of one of the wires plus the distance between the two wires.

Referring to FIG. 7, an electronic device 40 includes a base 100, a flexible substrate 200', and wires 306. Although the wires 306 are extended along an X direction as shown in FIG. 7, the number and configuration of the wires are not limited thereto. The configuration of the wires may be extended along a Y direction. The base 100 has an active area 102 and a peripheral area 104. The flexible substrate 200' may include a frame portion 200C and an extension portion 200D (the extension portion 200D may be the area outside the dotted line in FIG. 7). The frame portion 200C is adjacent to the active area 102, and the extension portion 200D may include a plurality of blocks 200D'. The extension portion 200D may extend beyond the edge of the base 100. In one embodiment, the extension portion 200D may be folded to the back side of the base 100. In another embodiment, the extension portion 200D may be foldable and fixed to a lateral side of the base 100. In this embodiment, the frame portion 200C may include, for example, a plurality of blocks 200C', and the blocks 200C' of the frame portion 200C and the blocks 200D' of the extension portion 200D may be configured correspondingly. If the wires or the electronic component of a certain block of the extension portion 200D is damaged, such configuration of wires is beneficial to repairing the block rapidly.

Referring to FIG. 8, since the extension portion 200B of the present disclosure reserves the area where the wires 300 and the wires 302 or electronic components are disposed, the area of the extension portion 200B where the wires 300 and the wires 302 or other electronic components are not disposed may be cut off to form its appearance as needed to cater to a special-shaped panel or customized requirements. Therefore, besides rectangles, the panels may be cut into round shape or other shapes based on the special-shaped panel or customized requirements. The electronic components may include logic integrated circuits, touch integrated circuits, or other suitable active or passive components. An electronic device 50 includes a base 110 and a flexible substrate 210. Although the wires are not illustrated in FIG. 8, wires may still be disposed on the base 110 and the flexible substrate 210 according to actual needs, and the number and configuration of the wires may also be adjusted according to actual needs. The flexible substrate 210 may include a frame portion 210A and an extension portion 210B (the extension portion 210B may be the area outside the dotted line in FIG. 8). The frame portion 210A is adjacent to the active area of the base 110, and the extension portion 210B may be composed of a plurality of blocks. The extension portion 210B may extend beyond the edge of the base 100. In one embodiment, the extension portion 210B may be folded to the back side of the base 100. In another embodiment, the extension portion 210B may be foldable and fixed to a lateral side (which is not illustrated herein) of the base 100.

Figure 9A:
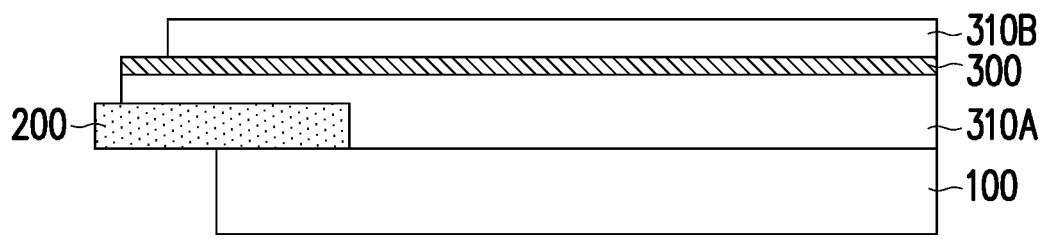
FIG. 9A to FIG. 9C are schematic cross-sectional views of a repairing process of an electronic device according to an embodiment of the disclosure.
Figure 9B:
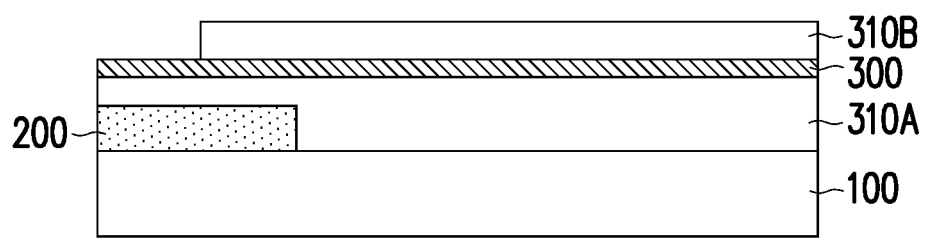
Figure 9C:
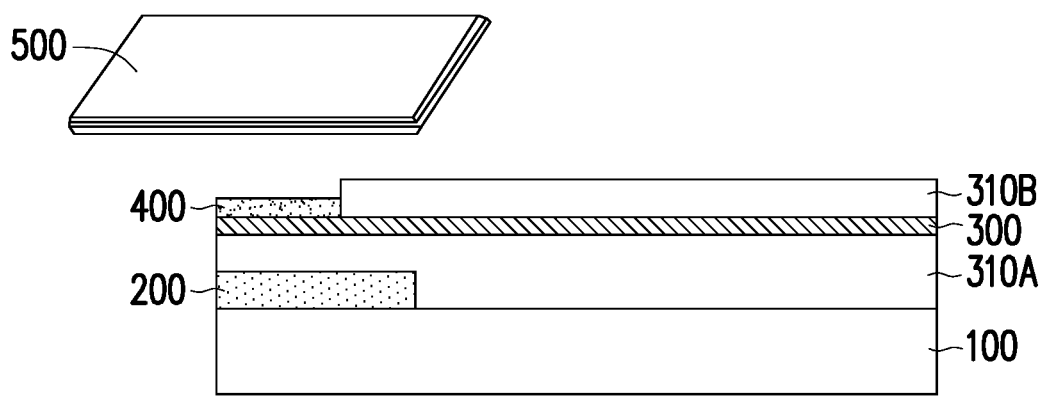

FIG. 9A to FIG. 9C are schematic cross-sectional views of a repairing process of an electronic device according to an embodiment of the disclosure. Referring to FIG. 9A and FIG. 9B, when the electronic device needs to be repaired (for example but not limited thereto, having a wire breakage, poor electrical connection of the wires, or defective flexible substrate in the process), first, a laser method is adopted to remove a part of the insulating layer 310A, a part of the flexible substrate 200, and a part of the wire 300 and a part of the insulating layer 310B above the flexible substrate 200, so that the wire 300 is partially exposed. Then, referring to FIG. 9C, a conductive adhesive 400 is disposed on the partially exposed wire 300. The conductive adhesive 400 may include, for example, an anisotropic conductive film (ACF), but is not limited thereto. Next, the conductive adhesive 400 is bonded a circuit board 500 to the wires and the circuit board 500 is facing downward to the conductive adhesive 400. The circuit board 500 may be a flexible circuit board. For example, the circuit board 500 may include a flexible printed circuit board (FPC) or a chip on film (COF), but it is not limited thereto. In one embodiment, the wire 300 is disposed between the circuit board 500 and the flexible substrate 200 (the insulating layer 310A may be omitted here), the flexible substrate 200 is disposed between the wire 300 and the base 100, and the wire 300 and the circuit board 500 are electrically connected through the conductive adhesive 400. In one embodiment, after the wire 300 and the circuit board 500 are bonded, the circuit board 500 may be foldable to the back side of the base 100.

In sum, in the embodiments of the present disclosure, the flexible substrate is disposed on the base and between the wires and the base, the wire extends from the active area to the peripheral area which partially overlaps the frame portion, the wire extends along the frame portion to the extension portion, the configuration of wires extending from the active area to the extension portion may be completed altogether. Such configuration of wires solves the difficulty in connecting the external circuit board and the electronic device with the increasingly high pixel density or wiring density, decreasing the pitch between the wires. Furthermore, since the configuration of wires extending from the active area to the extension portion may be completed altogether, the wiring density may be further increased, reducing greatly the failure rate of making connection, avoiding reworking, and thereby reducing material costs and improving the resolution. It may solve the problem arose from the increasingly smaller lead pitch of the flexible printed circuit board (FPC) or the chip on film (COF) and the issue of connecting the leads and the wires of the display device. Moreover, regarding the extension portion that extends from the base, the part of the extension portion provided with the circuit may be reserved, and the other part of the extension portion may be cut off to form its appearance as needed to cater to a special-shaped panel or customized requirements, solving the limit put on the appearance of the originally used external flexible printed circuit board or the chip on film as well as the limit on the number of integrated circuits.

The above embodiments are only used to illustrate the technical solutions of the disclosure without limiting the disclosure; although the disclosure has been described in detail with reference to the foregoing embodiments, those of ordinary skill in the art should understand that they may still recombine or modify the technical solutions described in each of the foregoing embodiments, or substitute some or all of the technical features with their equivalence; and the entities of those corresponding technical solutions with such combinations, modifications, or substitutions do not deviate from the scope of the technical solutions of the embodiments of the disclosure.

Although the present application has been disclosed in the above embodiments, they are not intended to limit the present application. Any person skilled in the art may make changes and modifications without departing from the spirit and scope of the present application, and thus the scope of the present application shall be subject to those defined in the claims as appended. Furthermore, the scope of the present disclosure is not limited to the process, machinery, manufacturing, material composition, device, method, and steps of the specific embodiments described in the specification. Anyone with ordinary knowledge in the art may comprehend the process, machinery, manufacturing, material composition, device, method, and steps developed at present or in the future from the present disclosure. Provided that the same functions or the same results substantially as the ones in the embodiments described herein may be implemented or obtained, they may be adopted according to the present disclosure. Hence, the scope of the present disclosure includes the above-mentioned process, machinery, manufacturing, material composition, device, method, and steps. In addition, each claim also constitutes an individual embodiment, and the scope of the present disclosure also includes the combinations of each claim and each embodiment. The scope of the present disclosure shall be subject to those defined in the claims as appended.

What is claimed is:

1. An electronic device, comprising:
a base, comprising an active area and a peripheral area;
a flexible substrate, disposed on the base, and located in the peripheral area, wherein the flexible substrate has a bottom surface, a top surface and a side wall, the bottom surface is disposed between the top surface and the base, and the side wall is connected to the top surface and the bottom surface;
a plurality of wires, disposed on the base and the flexible substrate,
wherein the plurality of wires extend from the active area to the peripheral area, and the flexible substrate is located between the plurality of wires and the base; and
an insulating layer, disposed between the plurality of wires and the flexible substrate, wherein the insulating layer covers the base, the side wall of the flexible substrate and the top surface of the flexible substrate.

2. The electronic device according to claim 1, wherein the plurality of wires are made in a same layer as any of a scan line, a common line, a data line, or a touch line in the active area.

3. The electronic device according to claim 1, wherein the insulating layer is located between the flexible substrate and the plurality of wires.

4. The electronic device according to claim 1, wherein a part of the plurality of wires in the active area and a part of the plurality of wires in the peripheral area belong to different conductive layers when the plurality of wires extend from the active area to the peripheral area.

5. The electronic device according to claim 1, wherein the flexible substrate comprises a frame portion and an extension portion, the frame portion partially overlaps the peripheral area, the extension portion is connected to the frame portion, the plurality of wires extend from the frame portion to the extension portion, and a pitch of the plurality of wires on the frame portion is equal to a pitch of the plurality of wires in the peripheral area.

6. The electronic device according to claim 1, wherein the flexible substrate comprises a frame portion and an extension portion, the frame portion partially overlaps the peripheral area, the extension portion is connected to the frame portion, the plurality of wires extend from the frame portion to the extension portion, and a pitch of the plurality of wires on the frame portion is not equal to a pitch of the plurality of wires in the peripheral area.

7. The electronic device according to claim 6, wherein when the plurality of wires are closer to the extension portion, a pitch is smaller.

8. The electronic device according to claim 1, wherein in the peripheral area, a pitch between the plurality of wires ranges from 3 μm to 40 μm.

9. The electronic device according to claim 1, wherein the flexible substrate comprises a frame portion and an extension portion, the frame portion partially overlaps the peripheral area, the extension portion is connected to the frame portion, the frame portion is adjacent to the active area, and the extension portion comprises a plurality of first blocks.

10. The electronic device according to claim 9, wherein the frame portion comprises a plurality of second blocks, and the plurality of second blocks of the frame portion are disposed correspondingly to the plurality of first blocks of the extension portion.

11. The electronic device according to claim 1, further comprising a circuit board, wherein the plurality of wires are disposed between the circuit board and the flexible substrate, and the circuit board is electrically connected to the plurality of wires through a conductive adhesive.

12. The electronic device according to claim 11, wherein after the wires and the circuit board are bonded, the circuit board is folded to a back side of the base.

13. The electronic device according to claim 1, wherein the flexible substrate comprises a frame portion and an extension portion, the frame portion partially overlaps the peripheral area, the extension portion is connected to the frame portion, and the frame portion surrounds the active area.

14. The electronic device according to claim 1, wherein the flexible substrate comprises a frame portion and an extension portion, the frame portion partially overlaps the peripheral area, the extension portion is connected to the frame portion, and the extension portion extends beyond an edge of the base.

15. The electronic device according to claim 14, wherein the extension portion is folded to a back side of the base.

16. The electronic device according to claim 14, wherein the extension portion is foldable and fixed to a lateral side of the base.

17. The electronic device according to claim 16, further comprising another insulating layer, wherein the wires are located between the insulating layer and the another insulating layer.

18. The electronic device according to claim 1, wherein the insulating layer is disposed on the base and a part of the flexible substrate.

19. The electronic device according to claim 18, wherein the flexible substrate comprises a frame portion and an extension portion, the frame portion partially overlaps the peripheral area, the extension portion is connected to the frame portion, and the insulating layer extends from the active area to the frame portion in the peripheral area.

20. The electronic device according to claim 18, wherein the insulating layer further extends to the extension portion.

* * * * *